United States Patent [19]

Bertram et al.

[11] Patent Number: 5,072,874
[45] Date of Patent: Dec. 17, 1991

[54] METHOD AND APPARATUS FOR USING DESOLDERING MATERIAL

[75] Inventors: Michael J. Bertram; Daniel M. Andrews; Thomas A. Bishop, all of Austin, Tex.

[73] Assignee: Microelectronics and Computer Technology Corporation, Austin, Tex.

[21] Appl. No.: 648,266

[22] Filed: Jan. 31, 1991

[51] Int. Cl.$^5$ ............................................... B23K 3/00
[52] U.S. Cl. ...................................... 228/264; 228/19
[58] Field of Search ................... 228/191, 264, 19, 35, 228/51, 52, 119

[56] References Cited

U.S. PATENT DOCUMENTS

| | | | |
|---|---|---|---|
| 3,627,121 | 12/1971 | Hood, Jr. | 228/19 |
| 3,751,799 | 8/1973 | Reynolds | 228/191 |
| 3,973,714 | 8/1976 | Lesyk et al. | 228/106 |
| 4,164,606 | 8/1979 | Spirig | 428/605 |
| 4,416,408 | 11/1983 | Spirig | 228/264 |
| 4,436,242 | 3/1984 | Shisler et al. | 228/264 |
| 4,614,858 | 9/1986 | Vial | 219/230 |
| 4,746,050 | 5/1988 | Brown | 228/57 |
| 4,813,589 | 3/1989 | Palmer et al. | 228/119 |
| 4,934,582 | 6/1990 | Bertram et al. | 228/191 |

FOREIGN PATENT DOCUMENTS

| | | | |
|---|---|---|---|
| 3600208 | 2/1987 | Fed. Rep. of Germany | 228/264 |
| 31573 | 2/1989 | Japan | 228/264 |
| 113171 | 5/1989 | Japan | 228/19 |
| 8908527 | 9/1989 | PCT Int'l Appl. | 228/264 |
| 1174200 | 8/1985 | U.S.S.R. | 228/264 |

OTHER PUBLICATIONS

Letter from Jim Bell to Ying-kit Lau, dated Oct. 2, 1990.
Product Bulletin, "R&R 88 SMD Repair and Replacement System", EPE Corporation.
Letter from Brian Duffy to James Johnson, dated Sep. 24, 1987.
IBM Technical Disclosure Bulletin, "Solder Wick", vol. 13, No. 2, p. 445 (Jul. 1970).
IBM Technical Disclosure Bulletin, "Desoldering Unit", vol. 21, No. 11, p. 4482 (Apr. 1979).

Primary Examiner—Samuel M. Heinrich
Attorney, Agent, or Firm—David M. Sigmond

[57] ABSTRACT

A desoldering material with an opening or window shaped so that the base of an electronic component can fit inside the opening while the desoldering material simultaneously contacts all solder joints which bond the component's outer leads to pads on a surface. A first adhesive secures the base to the surface, a second adhesive secures a retraction device to the base, the first adhesive is heated and softened without softening the second adhesive, and the retraction device removes the desoldered component from the surface. The invention is well suited to removing tape-automated-bonded integrated circuits adhesively attached to high density multichip module substrates.

40 Claims, 5 Drawing Sheets

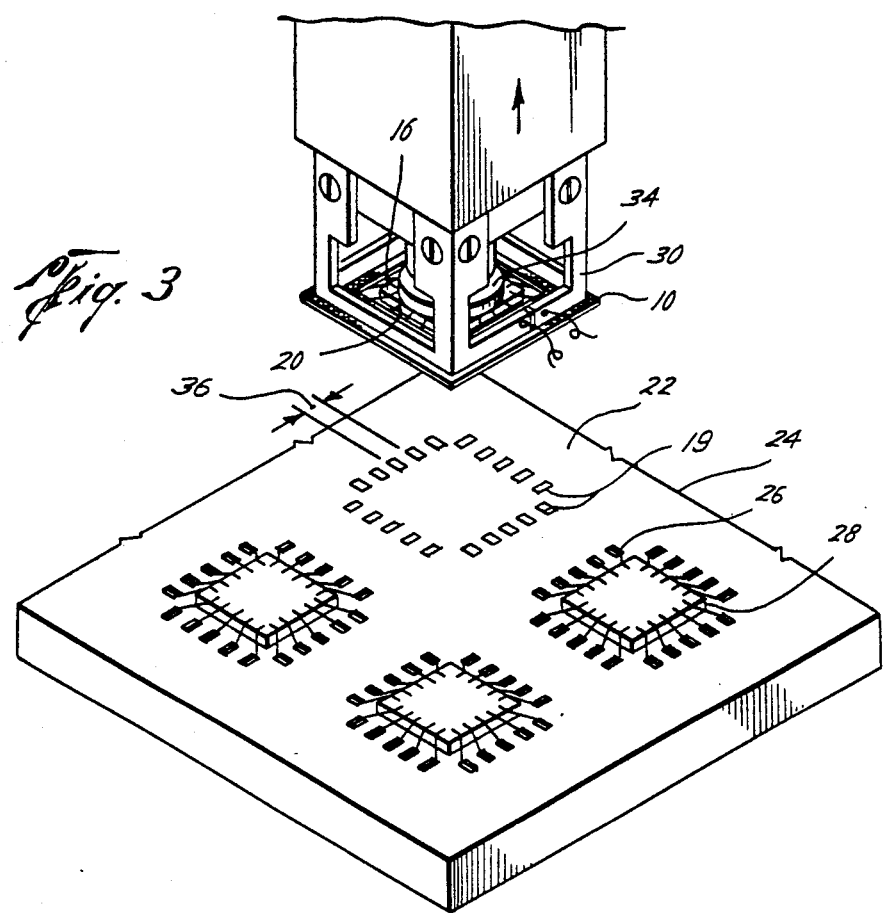
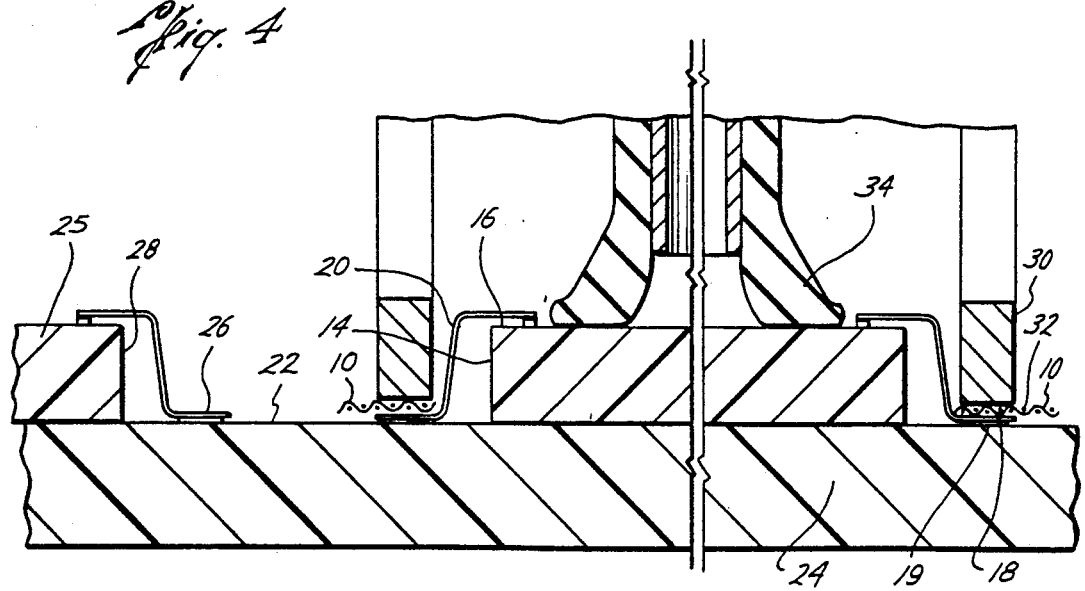

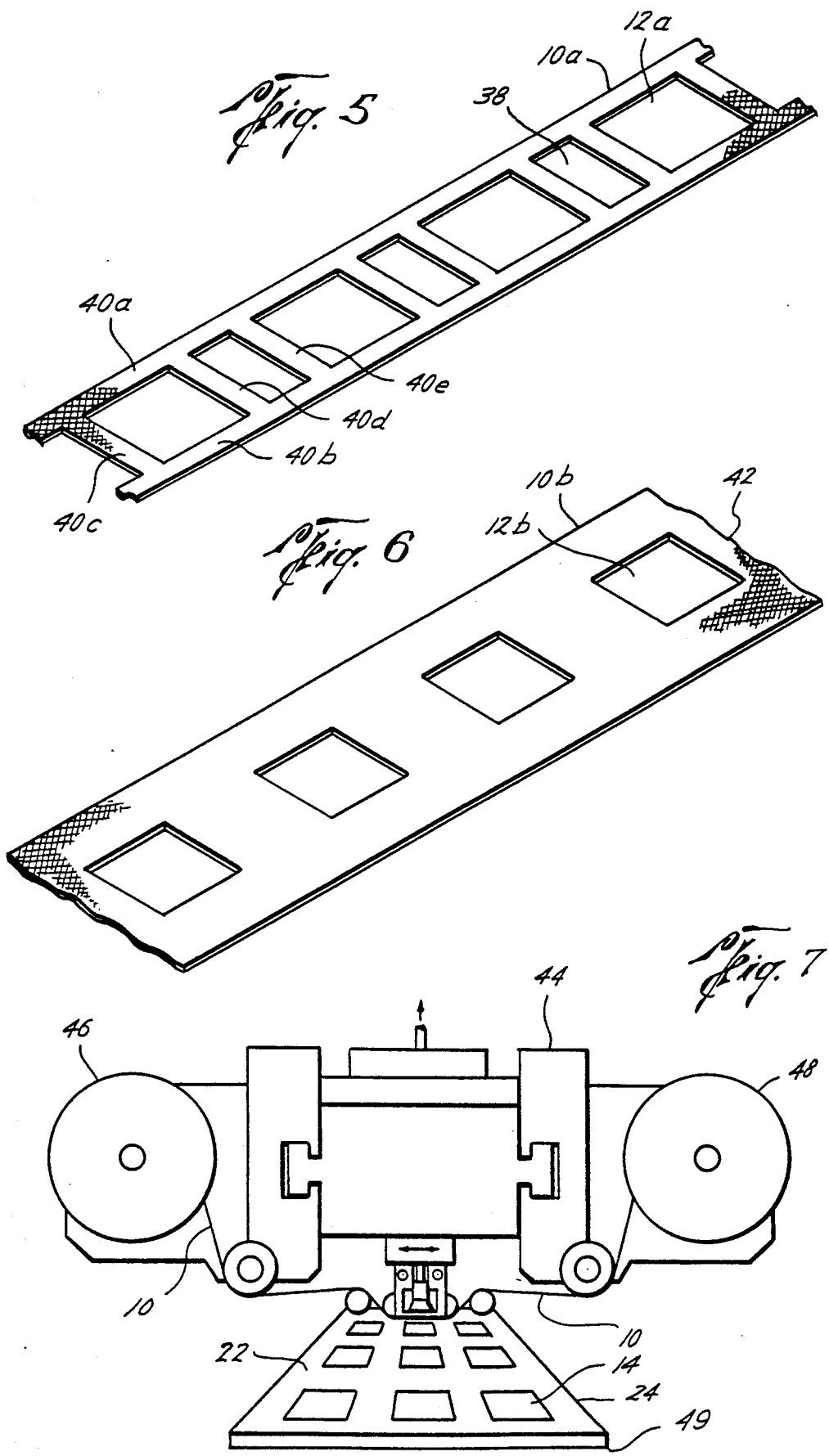

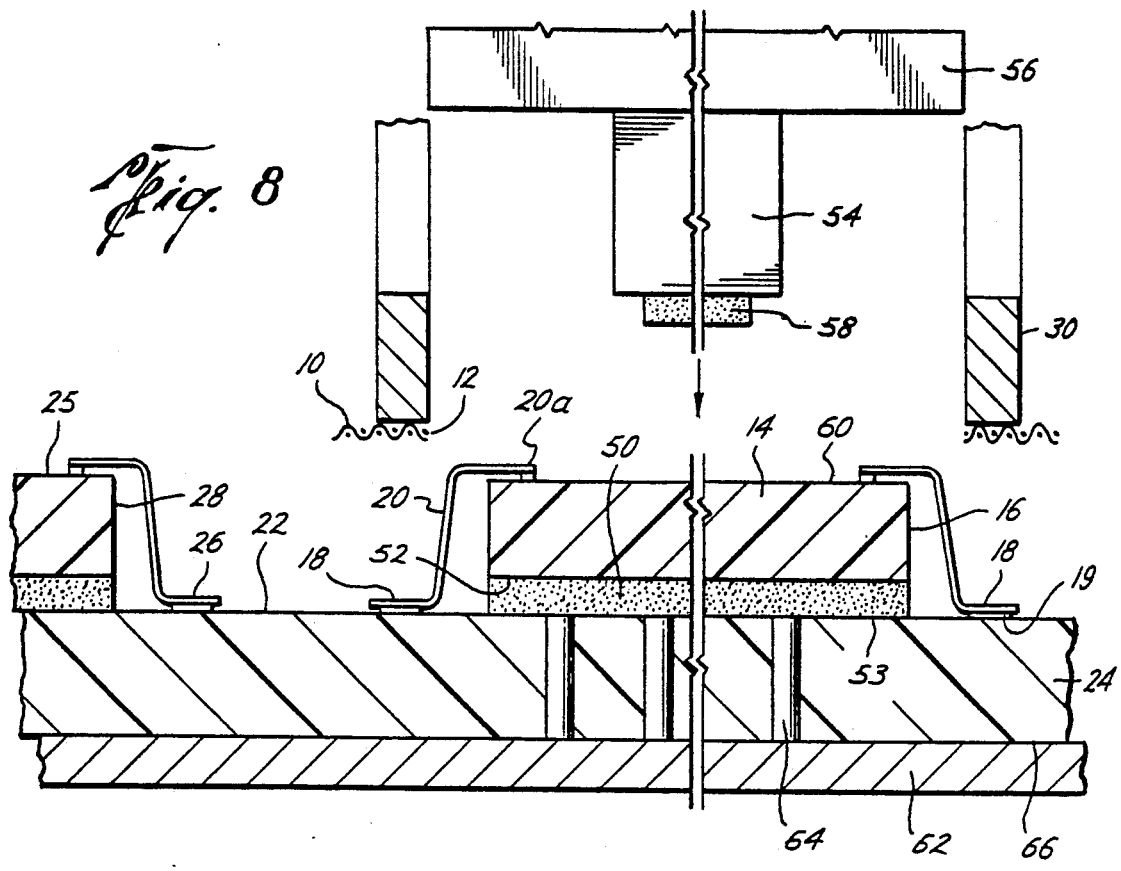
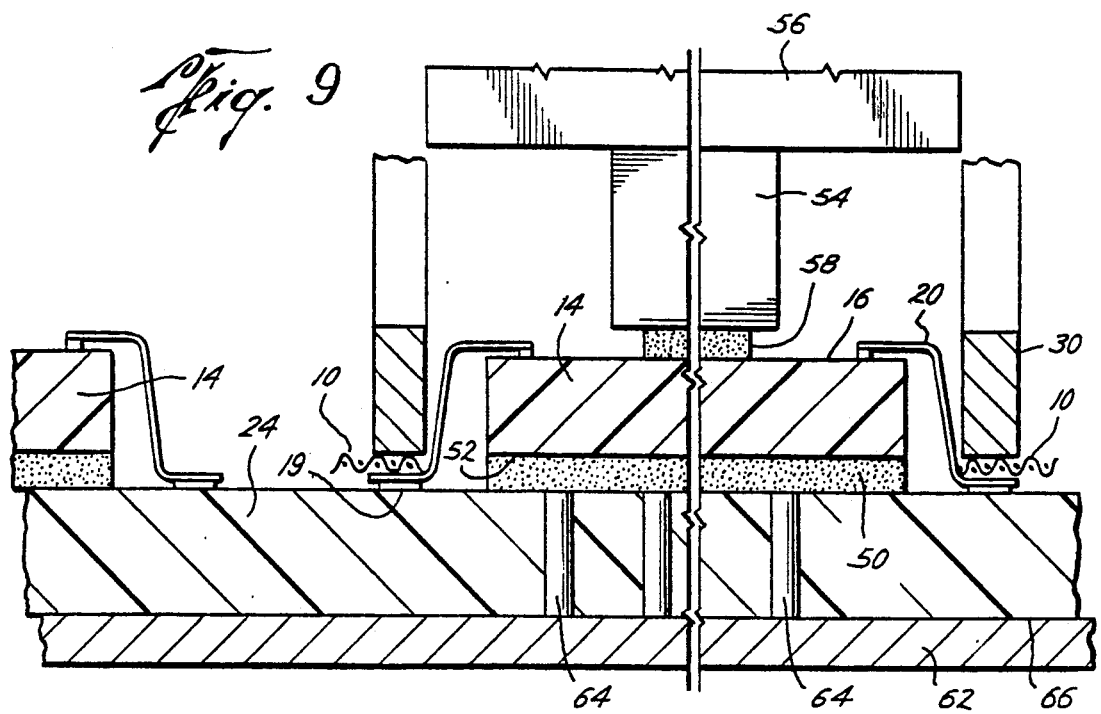

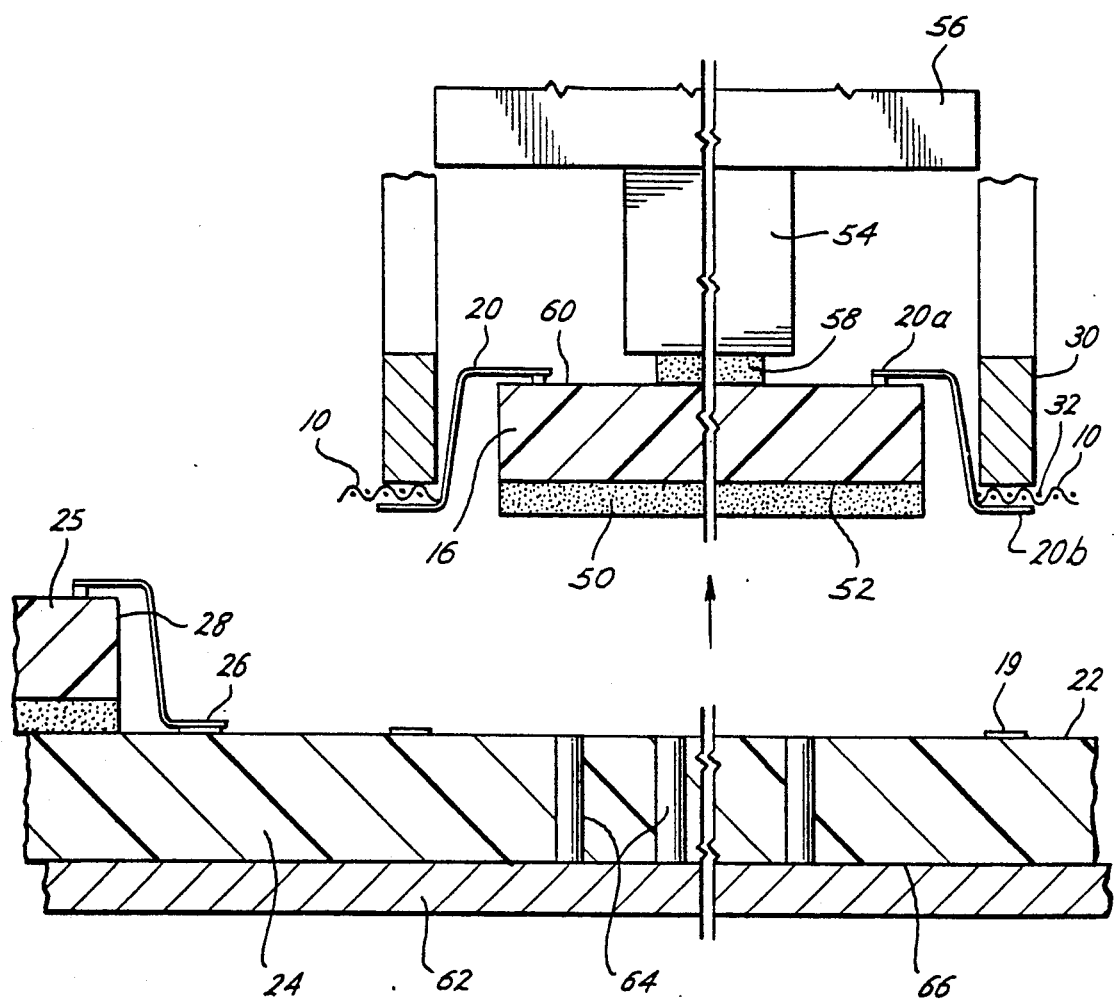

METHOD AND APPARATUS FOR USING DESOLDERING MATERIAL

BACKGROUND OF THE INVENTION

The present invention relates to a desoldering material for simultaneously desoldering each solder joint between an electronic component and a surface, and more particularly to the removal of a component which is both solder bonded and adhesively bonded to a surface Solder mounted electronic components or devices such as integrated circuit chips are typically positioned in close proximity to other components on a surface, such as the top of a high density substrate or a printed circuit board. When an electronic component fails, it is usually more economical to replace merely the bad device than to replace the entire substrate. But this removal and replacement operation needs to be done without damaging other components on the substrate.

There are numerous conventional methods for surface repair where the solder is heated and the device removed from the molten solder. For instance, heating by directing a hot gas is described in U.S. Pat. No. 4,813,589 to Palmer et al. where a tube allows hot air to be directed from an external heat source to an integrated circuit chip on a circuit board to be removed without permitting heat to flow to adjacent components. The chip is protected from heat by placing a vacuum suction cup on top of the chip. Heating by means of heated blades is described in U.S. Pat. No. 4,614,858 to Vial where a desoldering tool contains heater bars shaped to contact the solder terminations to be desoldered as well as grasp the component to be removed. These conventional techniques have the drawbacks of leaving the reworked site on the substrate with uneven amounts of solder, leaving varying amounts of brittle intermetallic compounds and oxides that can lead to poor soldering joints for replacement devices, and other reliability problems Further, the adverse effect of uneven solder thickness and intermetallic compounds becomes acute when the device lead center lines are less than 0.020 inches, since at these dimensions the total volume of solder is small and the effect of solder thickness variations and intermetallic particles is great. Additionally, with conventional repair techniques, broken leads not attached to electronic components will often remain on the substrate after the electronic components are desoldered and removed. It may then be necessary to remove the broken leads manually with tweezers and a soldering iron. This manual removal is time consuming and can also result in damage to the substrate or nearby components.

There exists a need for removing a solder mounted electronic component and any broken leads from a multi-component module in a single step while leaving a minimal amount of solder and intermetallic particles on the module surface, particularly for components which are also adhesively bonded to a module and have outer lead bonds with center lines spaced less than 0.020 inches.

SUMMARY

A feature of the present invention is a desoldering material with an opening or window shaped so that the base of an electronic component can fit inside the opening while the desoldering material simultaneously contacts all solder joints which bond the component's outer leads to pads on a surface.

An object of the present invention is a technique for desoldering an electronic component, comprising positioning a desoldering material above an electronic component disposed on a surface, wherein the electronic component comprises a base and a plurality of electrically conductive metal outer leads, the outer leads comprise first ends attached to the base and second ends extending beyond the outer periphery of the base and soldered at solder joints to pads on the surface, a first adhesive is positioned between the base and the surface to secure the base to the surface, and the desoldering material can absorb molten solder and comprises an opening shaped to receive the base of the electronic component; positioning the base inside the opening so that the desoldering material contacts each solder joint without contacting the base; heating the solder joints to at least the melting point of the solder to render the solder in the solder joints molten; flowing molten solder from the contacted solder joints into the desoldering material to simultaneously desolder the solder joints; providing a retraction device above the base; positioning a second adhesive between the base and the retraction device to secure the base to the retraction device; heating the first adhesive to soften the first adhesive so that the adhesive strength of the first adhesive is less than the adhesive strength of the second adhesive; removing the desoldering material from the surface after the solder joints are desoldered; and removing the component from the surface by moving the retraction device away from the surface after the solder joints are desoldered, the first adhesive is softened, and the second adhesive secures the base to the retraction device.

An advantage of the present invention is that the defective device, old solder, and broken leads attached to the solder joints can all be removed from a multichip module in a single operation without damaging or desoldering other components on the module.

Another advantage of the present invention is that a replacement electronic component can be soldered on the substrate under conditions similar to those used in the original soldering operation of the defective component.

A further advantage of the present invention is that after the component is removed from the surface the pads contain a solder coating less than 50 microinches thick.

Yet a further advantage of the present invention is the suitability for desoldering tape-automated-bonded (TAB) outer leads with center lines spaced less than 0.020 inches.

Still another advantage of the present invention is the ability to desolder and remove electronic components which are adhesively secured to a surface by a die attach material.

Other and further objects, features, and advantages will be apparent from the following description of the presently preferred embodiments of the invention, given for the purpose of disclosure, and taken in conjunction with the accompanying drawings.

BRIEF DESCRIPTION OF THE DRAWINGS

FIG. 3 is a perspective view similar to FIG. 1 illustrating the step of removing a solder-containing desoldering material and a desoldered electronic component from a mounting surface, FIG. 4 is an exploded cross-sectional view taken along line 4—4 for FIG. 2 illustrating a desoldering material in contact with the solder joints between an electronic component and a mounting surface, FIG. 5 is a perspective view illustrating a strip of desoldering material with multiple windows formed by bonding together pieces of desoldering material, FIG. 6 is a perspective view illustrating a strip of desoldering material with multiple windows formed by punching holes in a desoldering material, FIG. 7 is a schematic view illustrating the use of a reel-to-reel desoldering material in an automated desoldering system, FIG. 8 is an exploded cross-sectional view similar to FIG. 4 illustrating another embodiment of the present invention which includes a first adhesive between the electronic component and the mounting surface, FIG. 9 is an exploded cross-sectional view similar to FIG. 8 illustrating contacting the top of the component with a second adhesive attached to a retraction device, and FIG. 10 is an exploded cross-sectional view similar to FIG. 9 illustrating removing the component after desoldering the solder joints and softening the first adhesive.

DESCRIPTION OF THE PREFERRED EMBODIMENT

Figure 1:
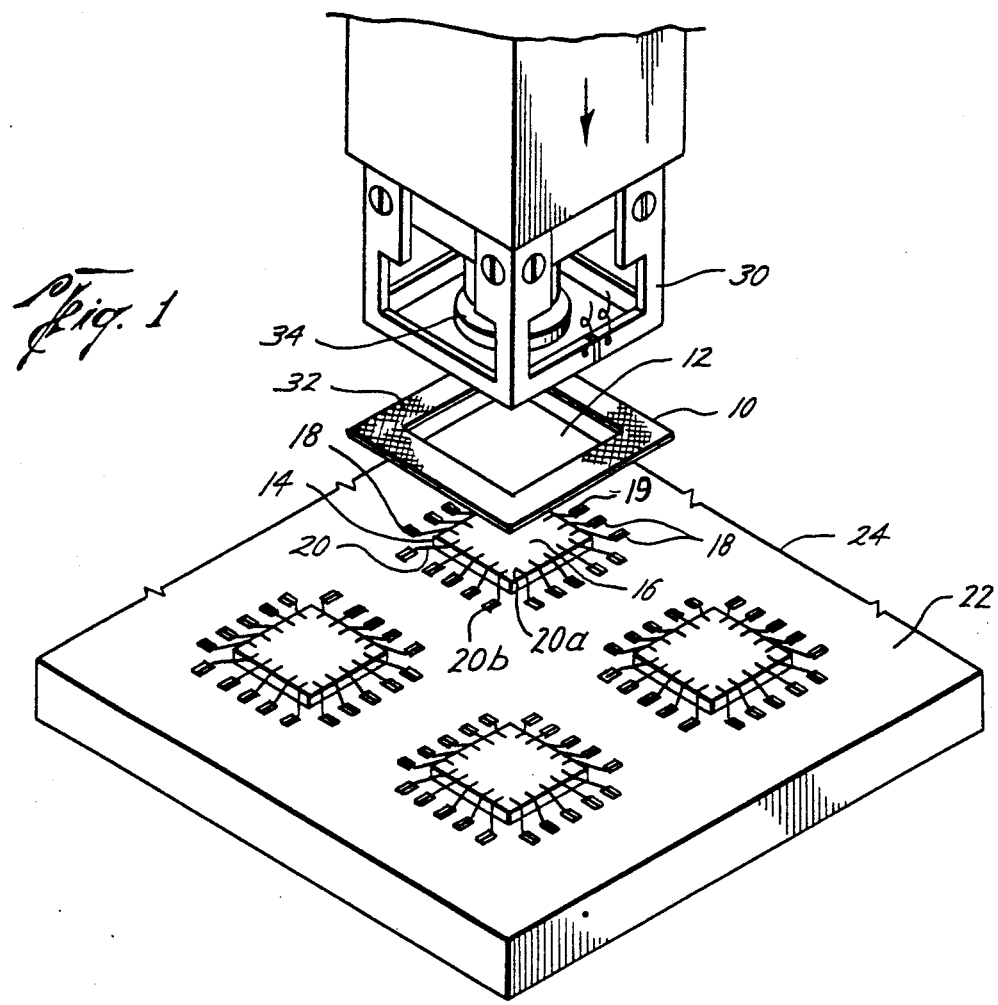
FIG. 1 is a perspective view of the present invention illustrating the step of aligning an electronic component, a desoldering material, and a heat source.

Referring now to the drawings and particularly to FIG. 1, a desoldering material 10 is used that is capable of absorbing molten solder. Desoldering material 10 preferably contains copper such as a braid of woven copper wires, and is coated or impregnated with flux such as sold under the trademark "SOLDER WICK." Other suitable materials capable of absorbing molten solder, including porous metals and metal plates with etched surfaces to increase surface area, are well known to those skilled in the art. The desoldering material 10 contains an opening shown as a rectangular window 12 above a defective electronic component 14. Window 12 is shaped to receive base 16 of component 14. This allows base 16 to be positioned inside window 12 whereby desoldering material 10 can surround base 16 without contacting base 16. Desoldering material 10 is also shaped to simultaneously cover each solder joint 18. Component 14 further comprises a plurality of electrically conductive metal outer leads 20 with first ends 20a attached to base 16 and second ends 20b extending beyond the outer periphery of base 16. Each second end 20b is soldered at a solder joint 18 to an electrical terminal or pad 19. Pads 19 are disposed on a top surface 22 of a multichip module substrate 24. Pads 19 protrude above surface 22, but may be in and aligned with surface 22. For illustration purposes, a rectangular integrated circuit chip 14 contains tape-automated-bonded (TAB) outer leads 20 soldered at solder joints 18 to pads 19 on top surface 22 of a high density copper/polyimide interconnect substrate 24. Desoldering material 10 is vertically positioned above component 14 by any conventional means so that desoldering material 10 can be lowered to simultaneously contact each solder joint 18 while the base 16 fits inside the window 12.

Figure 2:
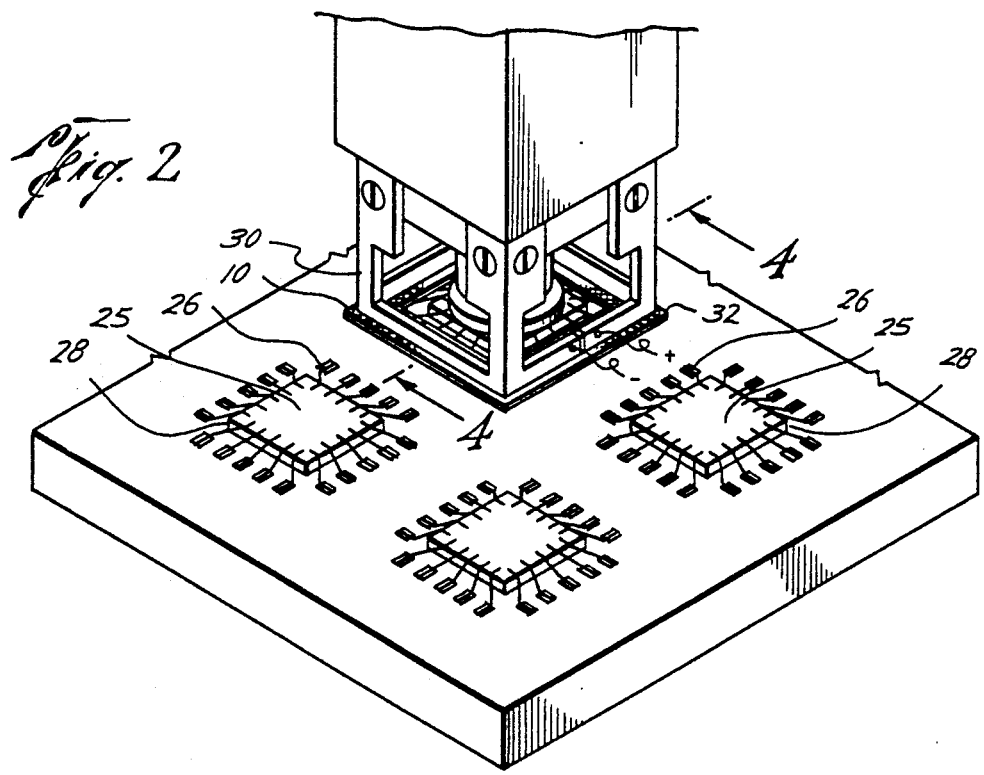
FIG. 2 is a perspective view similar to FIG. 1 illustrating the step of applying heat to the desoldering material from a heat source, and contacting the desoldering material to the solder joints between an electronic component and a mounting surface without contacting the base of the component.

With reference now to FIG. 2, desoldering material 10 is simultaneously brought in contact with each solder joint 18 while avoiding contact with base 16. In addition, desoldering material 10 avoids contact or interference with other heat sensitive areas on surface 22 such as base 25 and solder joints 26 of components 28 in close proximity to electronic component 14. Solder joints 18 must be heated at least to the melting point of the solder to render the solder in solder joints 18 molten. This can be accomplished by contacting desoldering material 10 to solder joints 18 in heat exchange relationship and contacting desoldering material 10 on the side opposite solder joints 18 in heat exchange relationship with a heat source shown as a blade thermode 30. Preferably thermode 30 has a shape similar to top side 32 of desoldering material 10 and lowers desoldering material 10 into contact with solder joints 18. Thermode 30 presses down on the side 32 of desoldering material 10 opposite to solder joints 18 to sandwich desoldering material 10 between thermode 30 and solder joints 18. This assures adequate heat exchange contact between thermode 30 and desoldering material 10 as well as between desoldering material 10 and solder joints 18. Heat then flows from thermode 30 into solder joints 18, and molten solder flows from solder joints 18 into and is absorbed by desoldering material 10 to simultaneously desolder solder joints 18.

Referring now to FIG. 3, after solder joints 18 are desoldered the desoldering material 10 can be retracted from surface 22. Furthermore, loose or detached outer leads 22 in contact with desoldering material 10 may adhere to desoldering material 10 due to surface tension and also be removed from surface 22 as desoldering material 10 is retracted. Desoldered component 14 can also be removed from surface 22. Component 14 can be vertically lifted off surface 22 either simultaneously or subsequent to the removal of the solder-containing desoldering material 10. Preferably electronic component 14 is lifted from surface 22 simultaneously with the retraction of thermode 30 and desoldering material 10. Various retraction devices for lifting electronic component 14 off surface 22 are known to those having skill in the art. In this embodiment, electronic component 14 is removed by contacting base 16 with a vacuum pipette 34 positioned centrally inside both window 12 and thermode 30. Pipette 34 secures to the top of base 16 by suction. Then, as thermode 30 and pipette 34 retract, electronic component 14 is lifted off surface 22 by vacuum pipette 34. At the same time, desoldering material 10 is also removed from surface 22 by the underlaying outer leads 20 which are raised as pipette 34 raises base 16.

After electronic component 14 is removed there will exist traces of solder on pads 19 from solder joints 18. Applicant has found, however, that the remaining solder forms a thin, nearly uniform coating less than 50 microinches thick. The removal of detached leads, intermetallic particles, and all but a thin, nearly uniform coating of solder will minimize the risk of inadvertent short circuits on surface 22. Furthermore, a new replacement component (not shown) with fresh solder can be solder attached in place under conditions similar to those used in the original surface mount soldering process. This facilitates a replacement operation.

With reference now to FIG. 4, a side view taken along line 4—4 of FIG. 2 illustrates the present invention in cross-section. Desoldering material 10 simultaneously contacts each solder joint 18 bonding an outer lead 20 to a pad 19 without contacting bases 25 or solder joints 26 of adjacent components 28. This assures that desoldering material 10 will not desolder or damage other components 28 on surface 22. Thermode 30 heats desoldering material 10 to at least the melting point of the solder. Thermode 30 also contacts and presses against desoldering material 10 on side 32 opposite solder joints 18 so that solder from solder joints 18 flows into desoldering material 10. Similarly, broken outer leads and intermetallic particles in contact with desoldering material 10 can adhere to desoldering material 10 and be removed when desoldering material 10 is retracted from surface 22. In addition, vacuum pipette 34 contacts and secures by suction to base 16. As soon as the desoldering is completed pipette 34 is retracted and component 14 is lifted off surface 22.

By way of example, a tape-automated-bonded electronic component having outer lead center lines spaced 0.012 inches apart was desoldered from an underlying high density interconnect substrate. The dimensions of component's base were 0.327 by 0.327 inches, and the lead lengths were 0.131 inches, of which 0.020 inches extended lengthwise from the base bottom and was solder bonded to the substrate. A woven copper braid of desoldering material was coated with flux to prevent the copper from oxidizing and becoming less attractive of molten solder. The desoldering material contained a window size of 0.460 by 0.460 inches, and exterior perimeter of 0.600 by 0.600 inches, and thus a length of 0.140 inches from the window edge to the exterior for covering the solder joints. The desoldering material was 0.011 inches thick. The desoldering material was positioned symmetrically above the solder joints and around the component's base. A blade thermode was heated to 300° C. to uniformly heat the desoldering material and melt the solder having a melting point of 180° C. The desoldering material was then sandwiched in between the solder joints and the thermode. The thermode applied a pressure of 6 grams per solder joint, totaling 1,032 grams. The solder was rendered molten and solder flowed from the solder joints into the desoldering material for about 7 seconds. Thereafter the component was removed and the remaining solder on the desoldered solder joints formed a nearly uniform coating less than 50 microinches thick. In a similar experiment, Applicant desoldered devices having TAB outer lead center lines spaced about 0.004 inches apart.

Referring now to FIG. 5, a desoldering material strip 10a is seen with a plurality of windows 12a shaped to surround an electronic component and contact its solder joints, as well as a plurality of windows 38 shaped to provide spacing between adjacent windows 12a. Windows 38 ensure that in usage the desoldering material will not contact other solder joints 26 or components 28 near the component 14 to be desoldered. Preferably, no more desoldering material 10a is present then is necessary to draw solder from each of the solder joints 18. Desoldering material strip 10a is formed by bonding together various separate pieces of solder wick 40a, 40b, 40c, 40d, and 40e so that the desired desoldering material strip structure is obtained.

With reference now to FIG. 6, another embodiment of a desoldering material strip is seen. Desoldering material strip 10b is formed by taking a single thick piece of copper wick 42, and then punching holes where windows 12b are desired. This embodiment may be preferred, for instance, where there do not exist heat sensitive areas outside solder joints 18 since desoldering material 10b is likely to be easier to fabricate then desoldering material 10a.

Referring now to FIG. 7, the use of the present invention desoldering material is shown in an automated desoldering system 44. A variety of automated systems are known to those having skill in the art, including many of the same systems that are used to do the original soldering of components 14 to a surface 22. One such system is a Farco 120 blade thermode bonding system. A strip of desoldering material 10 is fed from reel-out means 46 to reel-in means 48 so that a fresh non-solder filled section of desoldering material 10 can surround each defective component 14 to be desoldered. A component 14 can be positioned for desoldering by moving adjustable base 49. Then desoldering and removal can be performed as previously described. After desoldering, reel-out means 46 and reel-in means 48 can advance and align the next window 12 into place, and another electronic component 14 can be positioned for desoldering and removal.

The previously described embodiment of the present invention is preferred when component 14 is attached to surface 22 only by solder joints 18. However, it is common to place an adhesive material between base 16 and surface 22 to assure component 14 is fixedly secured thereon, for instance in the event solder joints 18 crack due to a severe mechanical jolt. Clearly the inclusion of such a sandwiched adhesive material will prevent the convenient removal of component 14 after the previously described desoldering operation. The embodiments that follow provide a solution to this problem. Unless otherwise specified, the steps and parts of the following embodiments are identical to the previously described embodiments.

With reference now to FIG. 8, there is seen a cross-sectional view similar to FIG. 4 in which a first adhesive 50 is positioned and sandwiched between lower surface 52 of base 16 and surface 22. First adhesive 50 fixedly secures component 14 to substrate 24. First adhesive 50 may be a standard die attach material such as epoxy or a thermoplastic material. First adhesive 50 can be an insulator or, alternatively, can electrically and/or thermally couple lower component surface 52 to the underlaying portion 53 of surface 22. An insulative first adhesive 50 can be rendered electrically and/or thermally conductive by being filled with appropriate metal particles. In any event, first adhesive 50 becomes soft at a temperature that is not sufficient to damage copper/polyimide substrate 24. More preferably, the melting point of the solder in solder joints 18 and the softening point of the first adhesive 50 are each between 150° C. and 200° C. This assures that solder joints 18 and first adhesive 50 will remain solid during normal operation of component 14 but can thermally be rendered non-solid to allow removal of defective component 14 without damaging substrate 24. A retraction device containing an aluminum slug or rod 54 replaces the vacuum pipette 34 of the previous embodiments. Rod 54 is shaped and positioned to fit centrally within thermode 30 and opening 12 of desoldering material 10 above top surface 60 of base 16 between the first ends 20a of outer leads 20. Retraction device 56 integral with rod 54 can be vertically actuated toward and from surface 22. A second adhesive 58 is positioned between rod 54 and base 16. Second adhesive 58 is used to secure rod 54 to base 16 so that rod 54 can remove component 14 from surface 22 after solder joints 18 are desoldered and first adhesive 50 is rendered soft. Therefore, when first adhesive 50 is heated and rendered soft, the adhesive strength of first adhesive 50 must be less than the adhesive strength of second adhesive 58. In the present example, the softening point (if it has one) of second adhesive 58 is well above 200° C. Second adhesive 58 can be a thermoset material without any melting point, or a thermoplastic such as sold under the trademark "PEEK" with a 400° C. melting point. There are several ways that second adhesive 58 can be positioned between rod 54 and base 16. As shown, a thermoplastic second adhesive 58 can be rendered molten on rod 54 and then cooled to solidify and adhere to rod 54. Thereafter rod 54 can be lowered to contact the thermoplastic to base 16. Alternatively, an uncured thermoset plastic second adhesive 58 can be dispensed on base top surface 60 and first contacted to rod 54 after rod 54 is lowered.

Referring now to FIG. 9, rod 54 is lowered and secured by second adhesive 58 to base 16. A thermoplastic second adhesive 58 can be temporarily rendered molten by heating rod 54 to 400° C. Thereafter the heating is discontinued and the thermoplastic cools, solidifies, and secures rod 54 to base 16. Or an uncured thermoset plastic second adhesive 58 can be cured (hardened) by heating rod 54 to 120° C. In either case, second adhesive 58 must have greater adhesive strength than first adhesive 50 before rod 54 can retract component 14 from surface 22. This can not be assumed while first adhesive 50 is solid. Accordingly, rod 54 supplies heat to render first adhesive 50 soft without supplying sufficient heat to soften or fracture second adhesive 58. In addition, and preferably simultaneously to rendering first adhesive 50 soft, thermode 30 presses desoldering material 10 against and in heat exchange contact with solder joints 18 and supplies heat to desolder contacted solder joints 18 into desoldering braid as previously described. While not essential, preferably the heating of solder joints 18 by thermode 30 and first adhesive 50 by rod 54 is aided by placing substrate 24 on a platen or hot plate 62. This reduces the localized thermal stress on substrate 24 from thermode 30 and rod 54. For instance, a 150° C. hot plate 62 can transfer heat through substrate 24 to surface 22 and heat solder joints 18 and first adhesive 50 by 25° C. The transfer of heat from hot plate 62 to surface 22 can be facilitated by installing metallic thermal vias 64 between top surface 22 and bottom surface 66 of substrate 24. Heating solder joints 18 and first adhesive 50 solely by placing substrate 24 on hot plate 62 is not normally preferred since this may loosen the solder joints and adhesives of other components 28 intended to remain on a multichip module substrate 24. However, in the event component 14 is the only component on substrate 24, the sole use of a hot plate 62 to heat solder joints 18 and first adhesive 50 would be convenient and preferable.

In any event, the heating renders the solder in solder joints 18 molten and the first adhesive 50 soft without rendering the second adhesive 58 soft. This assures that as rod 54 is retracted, the adhesive force of second adhesive 58 will far exceed the adhesive force the first adhesive 50. Component 14 will thereby be securely attached to rod 54 while placing minimal stress on base bottom surface 52 as it separates from soft first adhesive 50 and is lifted off surface 22. Nevertheless, the additional mechanical resistance from softened first adhesive 50 makes rod 54 with second adhesive 58 a preferred retraction device as compared to vacuum pipette 34.

With reference now to FIG. 10, retraction device 56 vertically raises rod 54 and lifts component 14 and desoldering material 10 off surface 22 without damaging substrate 24 or any other components 28 thereon. It should be clear that this retraction and removal step can also be accomplished by downwardly actuating surface 22 from a stationary retraction device 56. The vast majority of solder from desoldered solder joints 18 is absorbed by desoldering material 10 and removed from pads 19. Likewise, a substantial portion and preferably all of first adhesive 50 separates from surface 22 and adheres to base 16 as component 14 is retracted. However, it is also acceptable if some or all of first adhesive 50 remains on surface 22 and instead separates from base 16 as component 14 is retracted.

After component 14 is desoldered and removed from surface 22 the apparatus of the present invention can be adjusted to desolder and remove another electronic component. The advancement of a strip of desoldering material 10 to provide fresh solderless material has been previously described. Rod 54 can be detached and replaced with a new rod. Likewise, second adhesive 58 can be etched or mechanically fractured, or component 14 can be chiseled off.

The present invention, therefore, is well adapted to carry out the objects and attain the ends and advantages mentioned as well as others inherent therein. While a presently preferred embodiment of the invention has been given for the purpose of disclosure, numerous changes in the details of construction, arrangement of parts, and steps of the process will be readily apparent to those skilled in the art and which are encompassed in the spirit of the invention and the scope of the appended claims.

What is claimed is:

1. A method for desoldering an electronic component, comprising:
 positioning a desoldering material above an electronic component disposed on a surface, wherein
  the electronic component comprises a base and a plurality of electrically conductive metal outer leads, the outer leads comprise first ends attached to the base and second ends extending beyond the outer periphery of the base and soldered at solder joints to pads on the surface,
  a first adhesive is positioned between the base and the surface to secure the base to the surface, and
  the desoldering material can absorb molten solder and comprises an opening shaped to receive the base of the electronic component;
 positioning the base inside the opening so that the desoldering material contacts each solder joint without contacting the base;
 heating the solder joints to at least the melting point of the solder to render the solder in the solder joints molten;
 flowing molten solder from the contacted solder joints into the desoldering material to simultaneously desolder the solder joints;
 providing a retraction device above the base;
 positioning a second adhesive between the base and the retraction device to secure the base to the retraction device;
 heating the first adhesive to soften the first adhesive so that the adhesive strength of the first adhesive is less than the adhesive strength of the second adhesive;

removing the desoldering material from the surface after the solder joints are desoldered; and removing the component from the surface by moving the retraction device away from the surface after the solder joints are desoldered, the first adhesive is softened, and the second adhesive secures the base to the retraction device.

2. The method of claim 1 wherein the desoldering material is copper.

3. The method of claim 1 wherein the desoldering material is braid of woven copper wires.

4. The method of claim 1 wherein the desoldering material contains flux.

5. The method of claim 1 wherein the desoldering material is a strip with a plurality of openings and can be advanced in reel-to-reel form.

6. The method of claim 1 wherein the surface is the top planar surface of a multi-chip interconnect substrate, and the desoldering material and the component are simultaneously removed from the surface by moving the retraction device from the surface without damaging the substrate or any other electronic components on the substrate.

7. The desoldering material of claim 1 wherein the opening in the desoldering material is rectangular, the component is an integrated circuit chip with a rectangular base, and the outer leads are tape-automated-bonding leads with center lines spaced less than 0.020 inches which extend beyond the four vertical sides on the outer periphery of the base.

8. The method of claim 1 wherein the solder joints can be desoldered in less than 10 seconds.

9. The method of claim 1 wherein after the component is removed from the surface the pads contain a solder coating less than 50 microinches thick.

10. The method of claim 1 wherein any broken outer lead attached to a solder joint and disattached from the base adheres to the desoldering material and is removed from the surface as the desoldering material is moved away from the surface after desoldering occurs.

11. The method of claim 1 wherein the surface is the top of an electrical interconnect substrate.

12. The method of claim 11 wherein the substrate is placed on a hot plate and heat from the hot plate flows into the solder joints and the first adhesive.

13. The method of claim 12 wherein the substrate contains metallic thermal vias extending between the top and bottom surfaces of the substrate.

14. The method of claim 1 wherein a heated thermode contacts the side of the desoldering material opposite the solder joints as the desoldering material contacts the solder joints and heat from the thermode flows into the solder joints.

15. The method of claim 1 wherein the retraction device is heated and heat from the retraction device flows into the first adhesive without softening the second adhesive.

16. The method of claim 15 wherein a heated thermode presses down on the side of the desoldering material opposite the solder joints as the desoldering material contacts the solder joints and heat from the thermode flows into the solder joints.

17. The method of claim 16 wherein the surface is the top of an electrical interconnect substrate, the substrate is placed on a hot plate, and heat from the hot plate flows into the solder joints and the first adhesive.

18. The method of claim 1 wherein the second adhesive fails to soften below 200° C., the solder has a melting point below 200° C., and the first adhesive softens below 200° C.

19. The method of claim 1 wherein the second adhesive is a thermoset or thermoplastic material.

20. The method of claim 1 wherein the first adhesive is an epoxy or a thermoplastic material.

21. An apparatus for desoldering an electronic component, comprising:

a desoldering material capable of absorbing molten solder comprising an opening shaped to receive the base of the electronic component, wherein the electronic component is disposed on a surface, the electronic component comprises a base and a plurality of electrically conductive metal outer leads, the outer leads comprise first ends attached to the base and second ends extending beyond the outer periphery of the base soldered at solder joints to pads on the surface, and a first adhesive is positioned between the base and the surface to secure the base to the surface;

means for pressing the desoldering material against and in contact with the solder joints and positioning the base inside the opening without contacting the base to the desoldering material;

means for heating the solder joints to at least the melting point of the solder so that the solder in the solder joints can be rendered molten and flow from the contacted solder joints into the desoldering material to simultaneously desolder the solder joints;

a retraction device which can be positioned above the base and moved to and from the surface wherein a second adhesive between the base and the retraction device can secure the base to the retraction device;

means for heating the first adhesive to soften the first adhesive so that the adhesive strength of the first adhesive is less than the adhesive strength of the second adhesive; and wherein the retraction device can be moved away from the surface after the solder joints are desoldered, the first adhesive is softened, and the second adhesive secures the base to the retraction device, thereby removing the desoldering material and the component from the surface.

22. The apparatus of claim 21 wherein the desoldering material is copper.

23. The apparatus of claim 21 wherein the desoldering material is braid of woven copper wires.

24. The apparatus of claim 21 wherein the desoldering material contains flux.

25. The apparatus of claim 21 wherein the desoldering material is a strip with a plurality of openings and can be advanced in reel-to-reel form.

26. The apparatus of claim 21 wherein the surface is the top planar surface of a multi-chip interconnect substrate, and the component is desoldered and removed without damaging the substrate or any other electronic components on the substrate.

27. The desoldering material of claim 21 wherein the opening in the desoldering material is rectangular, the component is an integrated circuit chip with a rectangular base, and the outer leads are tape-automated-bonding leads with center lines spaced less than 0.020 inches which extend beyond the four vertical sides on the outer periphery of the base.

28. The apparatus of claim 21 wherein the solder joints can be desoldered in less than 10 seconds.

29. The apparatus of claim 21 wherein after the component is removed from the surface the pads contain a solder coating less than 50 microinches thick.

30. The apparatus of claim 21 wherein any broken outer lead attached to a solder joint and disattached from the base adheres to the desoldering material and is removed from the surface as the desoldering material is removed from the surface after desoldering occurs.

31. The apparatus of claim 21 wherein the surface is the top of an electrical interconnect substrate.

32. The apparatus of claim 31 wherein a hot plate provides means for heating the solder joints and the first adhesive and the substrate is placed on the hot plate.

33. The apparatus of claim 32 wherein the substrate contains metallic thermal vias extending between the top and bottom surfaces of the substrate.

34. The apparatus of claim 21 wherein the means for pressing the desoldering material and the means for heating the solder joints is a heated thermode which contacts the side of the desoldering material opposite the solder joints as the desoldering material contacts the solder joints and heat from the thermode flows into the solder joints.

35. The apparatus of claim 21 wherein the means for heating the first adhesive is the retraction device and heat from the retraction device flows into the first adhesive without softening the second adhesive.

36. The apparatus of claim 35 wherein the means for pressing the desoldering material and the means for heating the solder joints is a heated thermode which contacts the side of the desoldering material opposite the solder joints as the desoldering material contacts the solder joints and heat from the thermode flows into the solder joints.

37. The apparatus of claim 36 wherein the means for heating the solder joints and the first adhesive further comprise a hot plate, the surface is the top of an electrical interconnect substrate, the substrate is placed on the hot plate, and heat from the hot plate flows into the solder joints and the first adhesive.

38. The apparatus of claim 21 wherein the second adhesive fails to soften below 200° C., the solder has a melting point below 200° C., and the first adhesive softens below 200° C.

39. The apparatus of claim 21 wherein the second adhesive is a thermoset or thermoplastic material.

40. The apparatus of claim 21 wherein the first adhesive is an epoxy or a thermoplastic material.

* * * * *

UNITED STATES PATENT AND TRADEMARK OFFICE

CERTIFICATE OF CORRECTION

PATENT NO. : 5,072,874

DATED : December 17, 1991

INVENTOR(S) : Bertram et al.

It is certified that error appears in the above---identified patent and that said Letter Patent is hereby corrected as shown below:

Column 1, line 11, insert -- . -- after "surface".
Column 1, line 40, insert -- . -- after "problems".
Column 5, line 58, change "then" to -- than --.
Column 6, line 3, change "then " to -- than --.
Column 7, line 37, insert --10 -- after "braid".
Column 7, line 61, insert -- of -- after "force".

Signed and Sealed this

Twentieth Day of July, 1993

Attest:

MICHAEL K. KIRK

Attesting Officer     Acting Commissioner of Patents and Trademarks